United States Patent [19]

Van Veen

[11] 4,049,956

[45] Sept. 20, 1977

[54] METHOD OF AND MEANS FOR IN-LINE TESTING OF A MEMORY OPERATING IN TIME-DIVISION MODE

[75] Inventor: Wouter Martinus Dirk Van Veen, San Maurizio Canavese, Italy

[73] Assignee: CSELT - Centro Studi e Laboratori Telecomunicazioni S.p.A., Turino, Italy

[21] Appl. No.: 730,723

[22] Filed: Oct. 8, 1976

[30] Foreign Application Priority Data

Oct. 8, 1975 Italy .................................. 69494/75

[51] Int. Cl.² ........................ G11C 29/00; G06F 11/10
[52] U.S. Cl. ........................ 235/153 AC; 235/153 AM
[58] Field of Search ............... 235/153 AC, 153 AM; 340/174 ED, 173 BB; 364/900

[56] References Cited

U.S. PATENT DOCUMENTS

| 3,719,929 | 3/1973 | Fay et al. ................. | 235/153 AC |
|---|---|---|---|
| 3,727,039 | 4/1973 | Baker et al. ................ | 235/153 AM |
| 3,768,071 | 10/1973 | Knauft et al. ............... | 235/153 AM |
| 3,789,204 | 1/1974 | Barlow ...................... | 235/153 AM |
| 3,949,205 | 4/1976 | Hubert et al. ................ | 235/153 AM |

*Primary Examiner*—Charles E. Atkinson
*Attorney, Agent, or Firm*—Karl F. Ross

[57] ABSTRACT

A read/write memory of *n* stages, periodically addressed in a recurrent scanning cycle of *n* time slots in which binary words are written in and read out from respective stages, is connected to a data-handling network by way of a writing multiple and a reading multiple each traversing a respective selective inverter, i.e., an upstream inverter in the writing multiple and a downstream inverter in the reading multiple. The two inverters are controlled by a generator of pseudo-random binary signals, unrelated to those processed in the data-handling network, having an operating cycle coextensive with a scanning cycle. Depending on the character of the control signals issuing from this pseudo-random generator during each cycle, the two selective inverters pass the bits of their incoming words either in their original or in a complemented form; with words written in a memory stage in one cycle read out in the immediately following cycle, the control signals delivered to the two inverters are identical but staggered by one cycle so that the words appearing in the output of the downstream inverter match those fed into the upstream inverter in the preceding cycle when the memory operates properly. Under certain circumstances, when a memory stage is addressed out of turn so that loading and reading of its contents occur successively in the same cycle, the staggering of the two control signals is canceled. Malfunctions of the memory are detected by parity checks carried out on the words traveling along the reading multiple to the downstream inverter; an alarm signal is emitted upon the occurrence of an error in the same bit position in two consecutive cycles.

12 Claims, 9 Drawing Figures

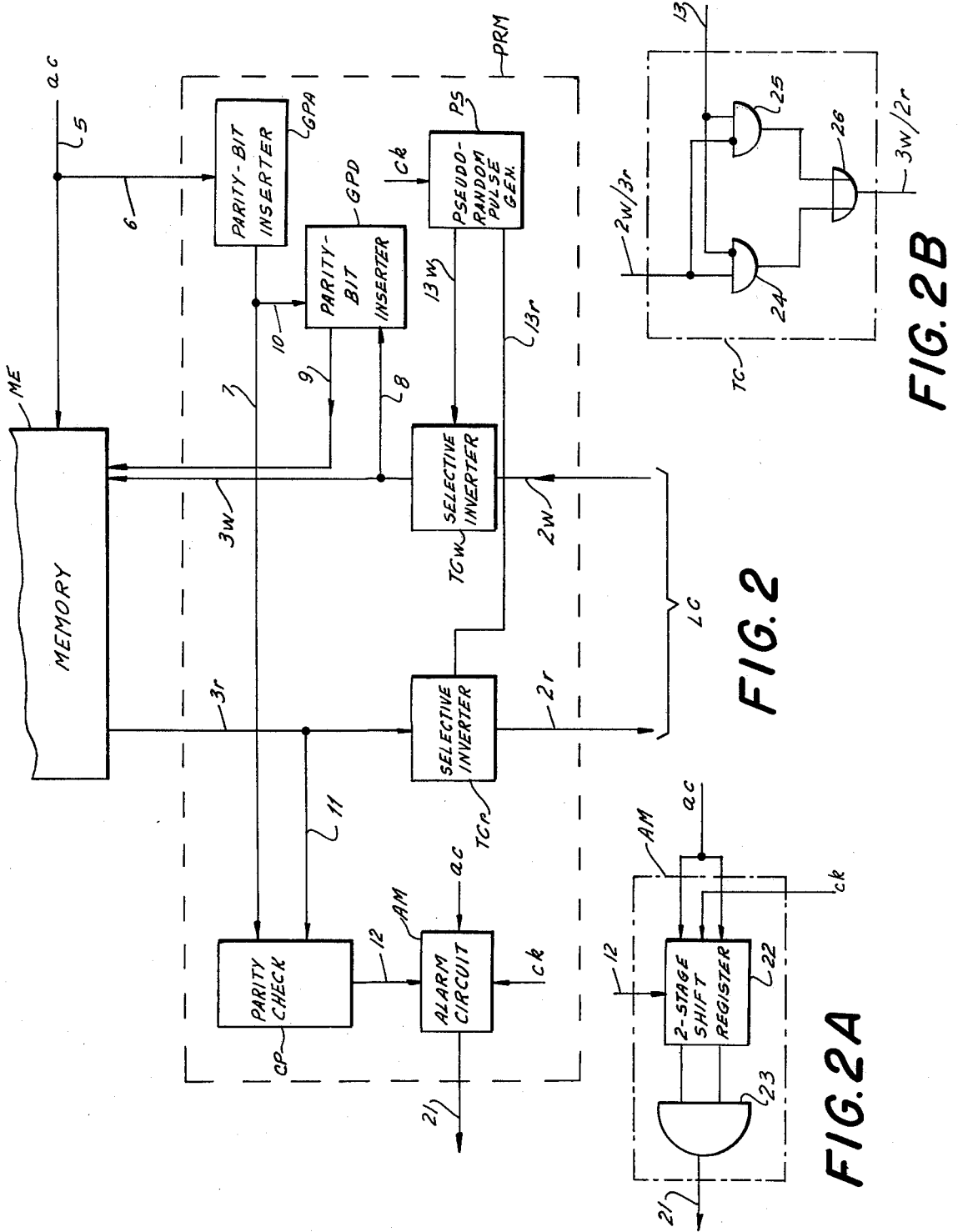

|     | I | II | III | IV | V | VI | VII | VIII | IX | X | XI | XII | XIII | XIV | XV |
|-----|---|----|----|----|---|----|----|----|----|---|----|----|----|----|----|
| 3r  |   | 0  | 0  | 0  | 0 | 0  | 0  | —  | —  | — | —  | —  | —  | —  | —  |
| 12  |   | OK | $\overline{OK}$ | OK | OK | $\overline{OK}$ | $\overline{OK}$ | — | — | — | — | — | — | — | — |
| 13r |   | 1  | 0  | 0  | 0 | 1  | 0  | 0  | 1  | 1 | 0  | 1  | 0  | 1  | 1  |
| 2r  |   | 1  | 0  | 0  | 0 | 1  | —  | —  | —  | — | —  | —  | —  | —  | —  |
| 2w  | 1 | 1  | 0  | 0  | 0 | 1  | —  | —  | —  | — | —  | —  | —  | —  | —  |
| 13w | 1 | 0  | 0  | 0  | 1 | 0  | 0  | 1  | 1  | 0 | 1  | 0  | 1  | 1  | 1  |
| 3w  | 0 | 1  | 0  | 0  | 1 | 1  | —  | —  | —  | — | —  | —  | —  | —  | —  |

FIG.4A

|     | I | II | III | IV | V | VI | VII | VIII | IX | X | XI | XII | XIII | XIV | XV |
|-----|---|----|----|----|---|----|----|----|----|---|----|----|----|----|----|
| 3r  |   | 0  | 0  | 0  | 0 | 0  | 0  | 0  | 0  | 0 | 0  | 0  | —  | —  | —  |
| 12  |   | OK | $\overline{OK}$ | OK | OK | OK | $\overline{OK}$ | OK | $\overline{OK}$ | OK | $\overline{OK}$ | $\overline{OK}$ | — | — | — |
| 13r |   | 1  | 0  | 0  | 0 | 1  | 0  | 0  | 1  | 1 | 0  | 1  | 0  | 1  | 1  |
| 2r  |   | 1  | 0  | 0  | 0 | 1  | 0  | 0  | 1  | 1 | 0  | —  | —  | —  | —  |
| 2w  | 1 | 1  | 0  | 0  | 1 | 1  | 0  | 0  | 1  | 1 | 0  | —  | —  | —  | —  |
| 13w | 1 | 0  | 0  | 0  | 1 | 0  | 0  | 1  | 1  | 0 | 1  | 0  | 1  | 1  | 1  |
| 3w  | 0 | 1  | 0  | 0  | 0 | 1  | 0  | 1  | 0  | 1 | 1  | —  | —  | —  | —  |

FIG.4B

|     | I | II | III | IV | V | VI | VII | VIII | IX | X | XI | XII | XIII | XIV | XV |
|-----|---|----|----|----|---|----|----|----|----|---|----|----|----|----|----|
| 3r  |   | 0  | 0  | 0  | 0 | 0  | 0  | 0  | 0  | — | —  | —  | —  | —  | —  |
| 12  |   | OK | OK | $\overline{OK}$ | OK | OK | OK | $\overline{OK}$ | $\overline{OK}$ | — | — | — | — | — | — |
| 13r |   | 1  | 0  | 0  | 0 | 1  | 0  | 0  | 1  | 1 | 0  | 1  | 0  | 1  | 1  |
| 2r  |   | 1  | 0  | 0  | 0 | 1  | 0  | 0  | —  | — | —  | —  | —  | —  | —  |
| 2w  | 1 | 0  | 1  | 0  | 1 | 0  | 1  | 0  | —  | — | —  | —  | —  | —  | —  |
| 13w | 1 | 0  | 0  | 0  | 1 | 0  | 0  | 1  | 1  | 0 | 1  | 0  | 1  | 1  | 1  |
| 3w  | 0 | 0  | 1  | 0  | 0 | 0  | 1  | 1  | —  | — | —  | —  | —  | —  | —  |

FIG.4C

METHOD OF AND MEANS FOR IN-LINE TESTING OF A MEMORY OPERATING IN TIME-DIVISION MODE

FIELD OF THE INVENTION

My present invention relates to a data-handling system, operating in the time-division mode, in which incoming data words are temporarily stored in respective stages of a multistage memory from which they are then read out for further processing, and more particularly to a method of and means for testing the performance of such a memory in line, i.e., without taking it out of normal operation.

BACKGROUND OF THE INVENTION

In such data-handling systems, e.g., as used in telecommunication, binary data words assigned to a multiplicity of channels in a recurrent scanning cycle or frame are processed in respective time slots with interim storage in corresponding memory stages, each stage consisting of a number of cells designed to receive the several bits of a data word to be inscribed therein. The contents of any stage may or may not be updated during a given cycle, i.e., the word previously stored therein may be reinscribed unaltered or may be replaced by another, depending on the activity of the respective channel.

The performance of such a memory may be conventionally monitored by logical circuitry designed to carry out a parity check, i.e., to determine whether there are an even or an odd number of unity bits — of binary value 1 — in a read-out word and/or in the address of the corresponding memory stage previously supplemented by a parity bit of the proper binary value. These parity checks enable a rapid detection of errors, either temporary malfunctions or systemic failures; the latter can be distinguished from the former by their recurrence in the same bit position in homologous time slots of consecutive scanning cycles. Thus, an alarm indication may be given if the parity check of a given channel has a negative outcome in two (or more) cycles immediately following one another.

There exists also the so-called echo-check method in which the contents of a memory stage are compared with the original data word as previously fed to that stage. In that case, however, each stage must be addressed twice for each word to be inscribed therein, with resulting lengthening of a scanning cycle. This technique, moreover, cannot be used for determining whether the memory has been correctly addressed, i.e. whether a data word has been written in the stage allocated to it.

The conventional parity-check method, too, has its limitations. Thus, if a malfunction of a memory cell distorts a data word by replacing a 1 with a 0 (or vice versa), and if that word is to be reinscribed in the stage from which it has been read out, then the parity check will fail only one since the reinscribed word will be accompanied by a matching parity bit and will undergo no further distortions in that stage. A systemic malfunction may, accordingly, be falsely interpreted as a temporary error.

OBJECT OF THE INVENTION

The object of my present invention, therefore, is to provide an improved method of monitoring the operation of such a memory with avoidance of the aforestated drawbacks, as well as reliable means for carrying out this method in a data-handling system.

SUMMARY OF THE INVENTION

Pursuant to my present invention, the incoming data words are loaded into the corresponding memory stages in either their original or an inverted form, depending on the absence or the presence of an inversion command which is generated during certain scanning cycles selected in a generally stochastic (i.e., random or pseudo-random) manner and which replaces the bits of these data words by their complements with the aid of a first selective inverter inserted in a set of writing conductors at a location upstream of the corresponding memory inputs. A true or inverted replica of this inversion command, usually lagging the latter by one scanning cycle, controls a second selective inverter inserted in a set of reading conductors, at a location downstream of the corresponding memory outputs, to reinvert any inverted data word retrieved from a memory stage. The incoming data words — inverted or not — are supplemented, at a point between the first inverter and the memory inputs, by parity criteria which are retrieved together with the read-out data words and are examined in a parity check at a point between the memory outputs and the second inverter. The irregular alternation between inverted and noninverted words insures that the aforedescribed distortion of a data word cannot be perpetuated without giving rise to a negative outcome of the parity check in at least two consecutive scanning cycles after a relatively small number of such cycles. I have found that, if a pseudo-random sequence of conrol signals is used for the purpose of actuating the selective inverters, it will generally suffice to extend that sequence over about 15 cycles in order to prevent any possible correlation between its bits and those of the data words written into the memory.

The aforementioned lag of one scanning cycle between the two preferably identical sequences of conrol signals or inversion commands applies to the situation where the several memory stages are sequentially identified, in the course of such a cycle, by address codes generated in a predetermined order during respective time slots each including a reading phase followed by a writing phase; with such synchronous addressing, a word inscribed in the writing phase of one cycle can be retrieved only in the reading phase of the homologous time slot of the next cycle. In some instances, however, parts of the writing and reading phases may be made available for asynchronous inscriptions and retrievals in response to the generation of out-of-turn addresses by an external source such as a processor receiving the extracted data words. Since this mode of operation may alter the relative time positions of the phases during which a data word is loaded into and extracted from a given stage, another feature of my invention resides in a modification of the relative timing of the related inversion commands, controlling the upstream and downstream inverters, in accordance with the relative ranks of synchronous and asynchronous addresses, i.e. the code regularly generated in that particular time slot and the out-of-turn code originating at the external source. The two codes may be alternately fed to the address input of the memory by a multiplexer switching over in the middle of a writing phase and of a reading phase.

BRIEF DESCRIPTION OF THE DRAWING

The above and other features of my invention will now be described in detail with reference to the accompanying drawing in which:

FIG. 2 is a more detailed circuit diagram of the memory tester shown in FIG. 1;

FIGS. 2A and 2B are schematic detail views of two components shown in FIG. 2;

FIGS. 4A, 4B and 4C are tablets relating to the operation of the memory tester of FIG. 2.

SPECIFIC DESCRIPTION

Figure 1:
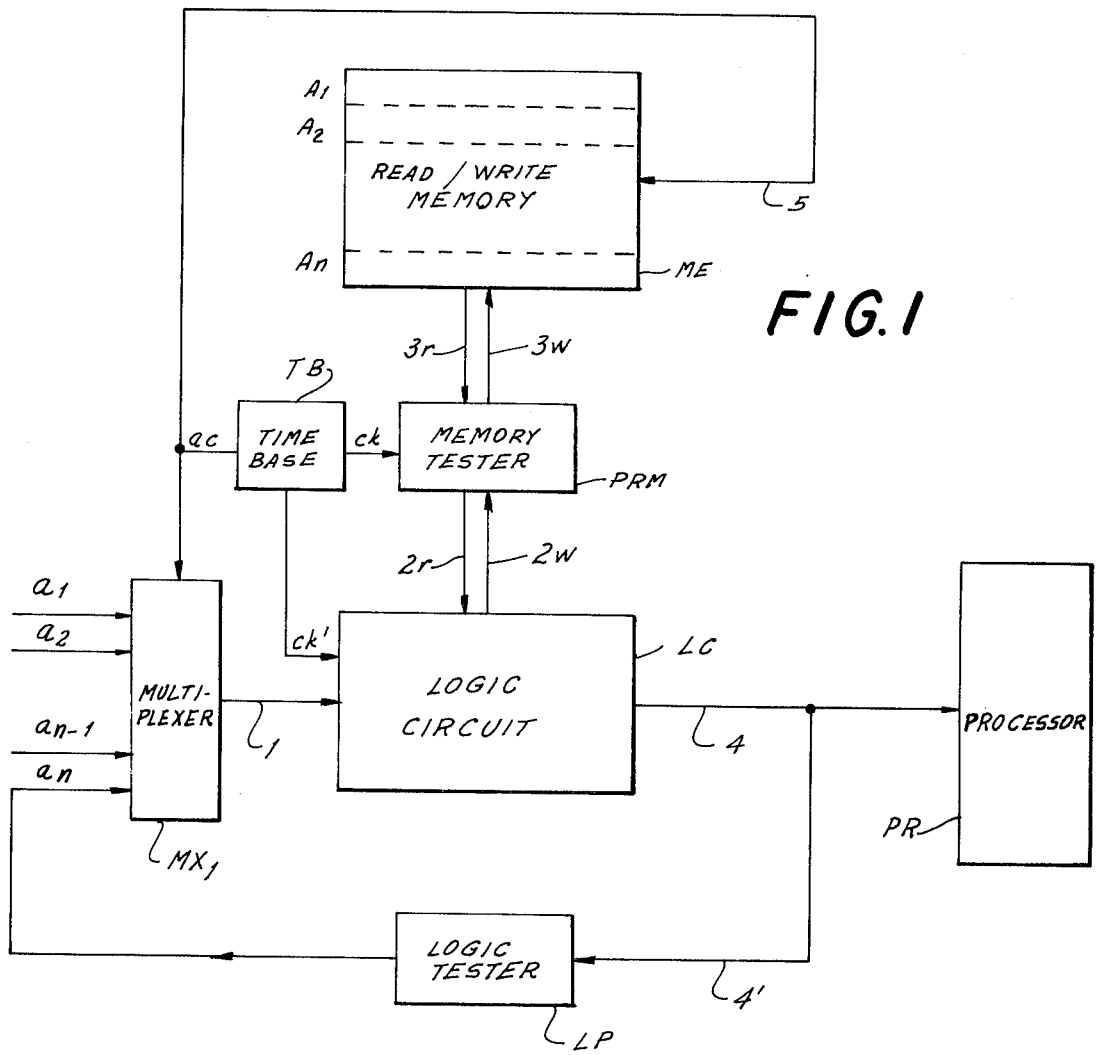
FIG. 1 is a block diagram showing the overall layout of a data-handling system provided with a memory tester embodying my invention.

In FIG. 1 I have shown a data-handling network comprising, essentially, a processor PR and an ancillary logic circuit LC to which data are periodically delivered, in a recurrent time-division frame, by way of a multiplexer $MX_1$ having $n$ data inputs $a_1, a_2, \ldots a_{n-1}, a_n$. Only the first $n-1$ inputs are connected to nonillustrated telecommunication channels. The last input $a_n$ serves, in a manner know per se, for checking the operation of logic circuit LC with the aid of a test circuit LP which generates a simulated input signal and receives the corresponding ouput signal from circuit LC, comparing it with stored information to determine whether that circuit functions properly.

Multiplexer $MX_1$ is controlled by a time base TB delivering a recurrent sequence of address codes ac to a setting input thereof, thereby cyclically connecting the inputs $a_1 - a_n$ to a conductor multiple 1 extending to circuit LC. The latter has an output multiple 4 leading to processor PR, a branch 4' of that multiple terminating at logic tester LP. A writing multiple 2w leads from circuit LC to a memory tester PRM, more fully described hereinafter, from which an extension 3w of that multiple leads to a set of writing inputs of a read/write memory ME with $n$ stages $A_1, A_2, \ldots A_n$ here assumed, for convenience, to be respectively associated with the inputs $a_1, a_2, \ldots a_n$ of multiplexer $MX_1$. Memory ME has an address input receiving, via a multiple 5, the cyclically changing signal ac from time base TB; that time base also sends clock pulses ck to memory tester PRM and clock pulses ck' to logic circuit LC. A reading multiple 3r leads from a set of outputs of memory ME to tester PRM, an extension 2r thereof continuing to circuit LC.

Logic circuit LC may operate, in a conventional manner, to feed data in the form of multibit words via writing multiple 2w, 3w to memory ME for temporary storage and to retrieve these stored data words, in the immediately following memory cycle or frame, by way of reading multiple 3r, 2r. The data words retrieved from a given memory stage, aside from being forwarded to processor PR, can be modified in response to the signal then present at the corresponding input of multiplexer $MX_1$; this modification may take the form, for example, of an incrementation of the binary value of the retrieved data word in conformity with the magnitude of the respective input signal and the subsequent reinscription of the word so incremented in the same memory stage. In such a case, the stored data word may be reinscribed unchanged if the associated input signal is zero. It is also possible that a counter in circuit LC loads a memory stage, in homologous time slots of successive frames, with a progressively increasing (or decreasing) numerical value independent of the magnitude of the input signal which is passed with or without modification to the processor.

The address code ac, generated by a binary counter in time base TB, has a numerical value increasing progressively from 1 through $n$ in the course of a scanning cycle so as to identify successive memory stages $A_1 - A_n$ during respective time slots. Each time slot, which may have a duration on the order of 4 $\mu$sec as is customary in telecommunication systems, is divided into a reading phase and a writing phase by the clock signal ck' which switches the logic circuit LC alternately to multiples 2r and 2w. With about 1,000 channels assigned to as many time slots and memory stages, the length of a scanning cycle is approximately 4 msec. Each stage has a multiplicity of cells designed to be loaded by respective bits of a data word arriving over multiple 3w, each incoming word canceling the previous entry.

The system shown in FIG. 1 is designed only for synchronous addressing, i.e., for an exclusive identification of the memory stages by the cylically recurring address codes ac emitted by time base TB. This means that all the operations concerning a given channel are carried out only in the time slot allotted thereto within a scanning cycle by the time base.

FIG. 2 shows details of a unit PRM, which monitors the performance of channel memory ME, as used in such a synchronous system. This unit comprises a conventional parity-bit inserter GPA which is connected to a branch 6 of multiple 5 for receiving the address codes ac present thereon during both reading and writing phases. These address codes, complemented by a parity bit of binary value 0 to 1 as is well known per se, appear on an output multiple 7 of component GPA which extends to a parity tester CP and, via a branch 10, to another parity-bit inserter GPD to which the incoming data words are fed by way of a branch 8 of writing multiple 3w. Component GPD generates parity bits on the basis of the combined bits of the incoming data word and the corresponding writing address, disregarding the parity bit already added to the latter in component GPA; the parity bit for the address and data combination is forwarded to a cell of memory ME over a lead 9 and subsequently reaches the parity tester CP, together with the retrieved data word, from reading multiple 3r via a branch 11. The result of the parity check performed by component CP is communicated to an alarm circuit AM by way of a multiple 12; if the outcome of that parity check is negative for any bit position in homologous time slots of two consecutive scanning cycles, circuit AM generates on an output 21 an alarm signal which may alert an operator and/or or automatically substitute a standby memory for the up to then active memory ME.

A selective inverter TCw, also known as a true/complement circuit, is inserted between the writing multiple 2w and its extension 3w, thus at a location upstream of the point where the branch 8 extends from that multiple to parity-bit inserter GPD. A similar selective inverter TCr lies between reading multiple 3r and its extension 2r, thus at a location downstream of the point where the branch 11 of that multiple extends to parity tester CP. A pseudo-random pulse generator PS serves as a supply of control signals for these inverters, emitting a series of irregularly spaced actuation commands for the inverter TCw on a lead 13w and a replica of that series for the inverter TCr on a lead 13r. Pulse generator PS is stepped by the clock signal ck from time base TB so that its operating cycle coincides with a scanning cycle of memory ME. A pseudo-random bit sequence generated on its output leads 13w and 13r has a recurrence period of 15 cycles. The bit sequence on lead 13r lags the one on lead 13w by one cycle; it will be assumed that the two sequences are identical, though in principle they could also be mutually complementary if one of the inverters were correspondingly modified.

The mode of operation of inverters TCw and TCr is such that each of them passes the bits of data word unchanged if the signal on its control lead 13r or 13w has the binary value 0; if that signal has the value 1, the inverter complements the data word bit by bit before sending it on to memory ME or logic circuit LC, respectively. The complementation occurring from time to time in the inverter TCw is taken into account by the parity-bit inserter GPD during a writing phase and by the parity tester CP during the next reading phase involving the same memory stage. The effect of these generally stochastically occurring inversions will be discussed hereinafter with reference to FIGS. 4A, 4B and 4C.

FIG. 2A illustrates the details of alarm circuit AM which comprises a two-stage shift register 22, each of its stages having n rows of cells corresponding to those of memory ME. If the parity check carried out in any bit position of a retrieved data word is negative, i.e., indicative of a malfunction, an error bit is loaded into the corresponding cell of a row of the first register stage identified by the address code ac. That error bit is transferred to the corresponding cell of the second register stage as the shift register 22 is stepped by the clock signal ck at the end of each scanning cycle. If the same cell of the first register stage again receives an error bit in that next cycle, an associated AND gate 23 (representative of a multiplicity of such gates) energizes the lead 21 through a nonillustrated OR gate linking the outputs of all these AND gates.

In FIG. 2B I have illustrated a suitable logic circuit for a selective inverter TC representative of both inverters TCw and TCr. The inverter comprises two sets of AND gates 24 and 25, each represented by a single gate, to which the respective conductors of multiple 2w or 3r are connected in parallel. Each of these conductors terminates at a noninverting input of the associated gate 24 and at an inverting input of the associated gate 25 whereas control lead 13 (representative of lead 13w or 13r) terminates at an inverting input of each gate 24 and a noninverting input of each gate 25. The two AND gates 24 and 25 work into an OR gate 26 whose output lead is representative of any conductor of multiple 3w or 2r. It will thus be apparent that in the de-energized state of lead 13, with gates 25 blocked, gates 24 will pass the noninverted bits appearing on conductors 2w/3r whereas with leas 13 energized, resulting in the blocking of gates 24, gates 25 will pass the complements of those bits.

Reference will now be made to FIGS. 4A, 4B and 4C for an explanation of the functioning of the memory tester PRM under three typical operating conditions. In all these instances only a single bit of data word stored in a particular stage of memory ME will be considered, it being assumed that the memory cell assigned to this bit is defective and cannot receive a bit 1.

The table of FIG. 4A relates to the case where the channel here considered is in a steady state, resulting in an iterative reinscription of the same data word over an indefinite number of cycles. Fifteen such cycles, falling within a recurrence period of the pseudo-random signal which appears on lead 13w, have been designated I - XV. The table shows the bits present in these cycles on a particular conductor of each multiple 2r, 2w, 3r, 3w, 13r, 13w and 12, each of these conductors being represented by a correspondingly labeled row. For the sake of simplicity, it is further assumed that the memory ME is empty at the beginning of the first cycle I.

The three bottom rows, representing conductors 2w, 13w and 3w associated with the writing section of the memory, illustrate the above-discussed relationship between the bit of an incoming data word and a concurrently generated bit of the pseudo-random control sequence. The same relationship exists among the bits appearing on conductors 3r, 13r and 2r associated with the reading section. If the parity check is successful, i.e., positive, conductor 12 carries a signal OK which may simply mean the absence of energization; i.e., a bit 0. If that test fails, the signal is an error bit of value 1 designated $\overline{OK}$.

In the specific example given, an incoming data bit on conductor 2w has the value 1 in cycle I and coincides with a control bit of like value of conductor 13w whereby its complement 0 appears on conductor 3w. The defective memory cell invariably registers this type of bit so that the subsequent parity check in cycle II is positive as the bit 0 is read out on the conductor 3r and is reconverted to a bit 1 on conductor 2r by the simultaneous presence of a delayed control bit of the same value on conductor 13r. Since it is supposed that logic circuit LC returns the retrieved data words unchanged to memory ME for reinscription, the bit present on conductor 2w during cycles II and following will be identical with the one present on conductor 2r in the immediately preceding cycles. Thus, conductor 2w now carries a bit 1 which, in the presence of a control bit 0 on lead 13w, is transmitted unchanged to conductor 3w for entry in the defective memory cell. Since that cell continues to register a bit 0, the parity check in cycle III yields an error signal $\overline{OK}$ as the same bit 0 travels unaltered over conductors 3r and 2r to logic network LC. In the writing phase of cycle III, this bit is reinscribed in the memory where the defect of the assigned cell does not manifest itself so that parity tester CP again has an output OK. This operation is repeated in the reading phase of cycle V in whose writing phase, however, the bit 0 is changed once again to 1 since the control bit on lead 13w has now also taken the value 1. Thus, the defect of the memory cell shows up in the reading phase of cycle VI in which the control signal on lead 13w again has the value 0; the same data bit 1, therefore, is fed once again to the defective memory cell in cycle VII so that the error bit $\overline{OK}$ recurs, resulting in the immediate emission of an alarm which terminates the operation of the memory.

The table of FIG. 4B has the same layout as that of 4A and reflects the situation in which the channel here considered experiences a change of state in cycle V so that the bit 0 read out in that cycle on conductor 2r is not reinscribed but is replaced by a bit 1 on conductor 2w. It will be seen that, in this instance, two consecutive error bits $\overline{OK}$ are generated in cycles XI and XII to establish the alarm condition.

The analogous table of FIG. 4C represents a situation in which a counter in logic circuit LC delivers alternate bits 0 and 1 to writing conductor 2w in consecutive scanning cycles, independently of the character of the corresponding input signal passed by multiplexer $MX_1$ (FIG. 1). The error bit $\overline{OK}$ occurs here consecutively in cycles VIII and IX to terminate the operation of the memory.

From the foregoing it will be seen that a systemic malfunction of the character discussed above will be detected well within the recurrence period of the pseudo-random control sequence, i.e., within an interval ranging between 8 and 60 msec if each cycle has the aforementioned length of approximately 4 msec.

If the malfunction occurs in the address section of the memory, i.e., if a particular stage cannnot be made accessible, the data word accompanying the corresponding address code will generally be written in a different stage (usually an adjoining one), displacing the previous entry. Component CP, which carries out the parity check on the basis of the combined address and data bits (while ignoring the parity bit added in the component GPA), will then detect a discrepancy and will emit an error signal on its output 12. Thus, the system according to my invention is effective in ascertaining both types of malfunctions. Any defect in the address code itself will be revealed by the accompanying parity bit in another part of component CP operating in the conventional manner.

Figure 5:
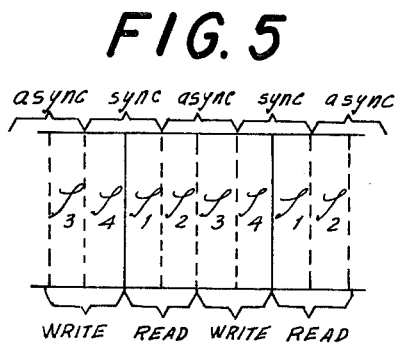
FIG. 5 is a graph relating to the operation of the memory tester shown in FIG. 3.
Figure 3:
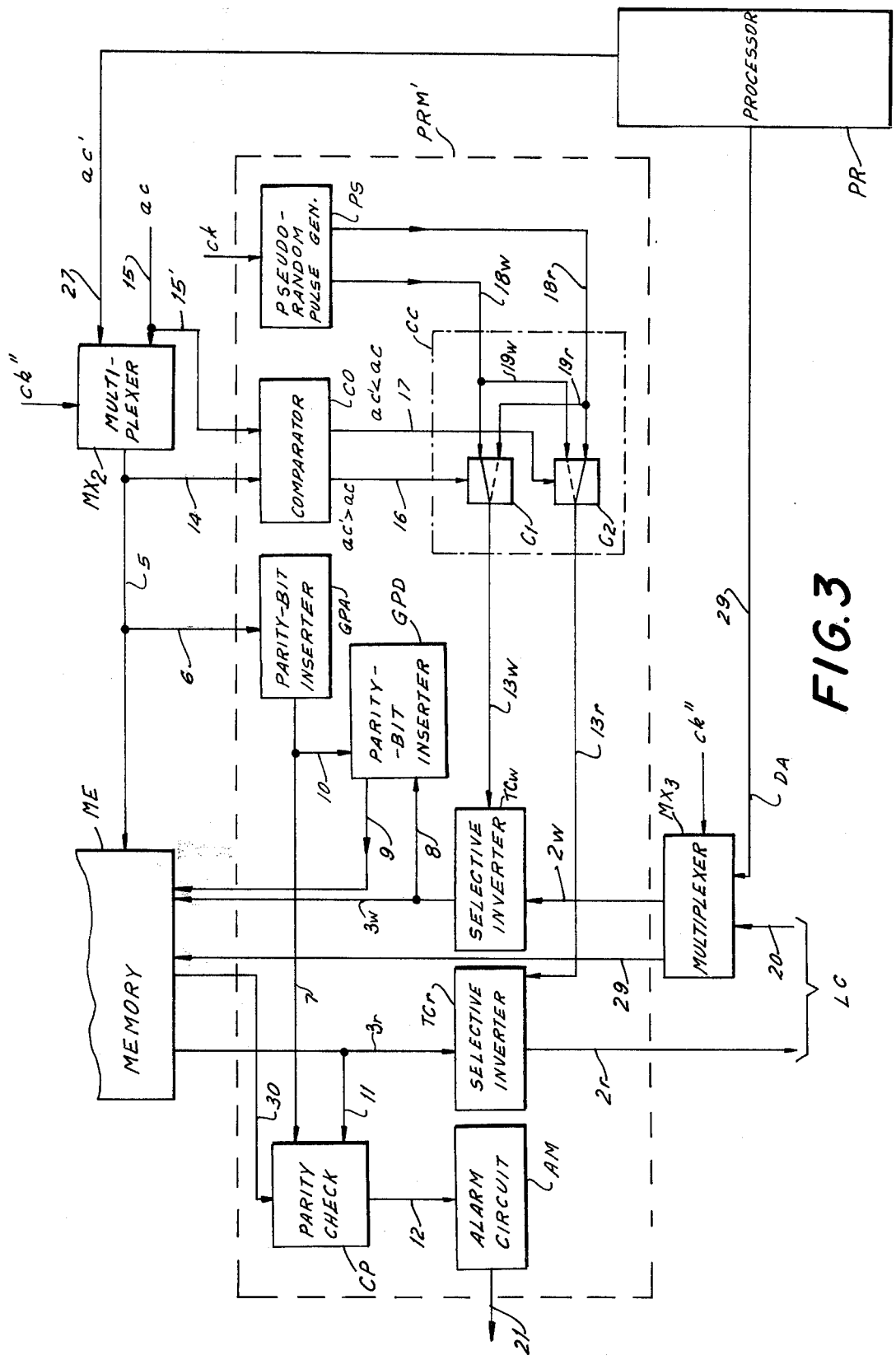
FIG. 3 is a circuit diagram similar to FIG. 2, illustrating a modified memory tester.

A modified memory tester PRM', shown in FIG. 3, is designed for a system in which the reading and writing phases are each subdivided into two parts $\phi_1$, $\phi_2$ and $\phi_3$, $\phi_4$ as illustrated in FIG. 5, each of these subphases lasting for about 1 μsec. Phases $\phi_1$ and $\phi_4$ are allocated to synchronous reading and writing, as defined above, whereas phases $\phi_2$ and $\phi_3$ are available for asynchronous reading and writing at addresses supplied out of turn by the processor PR as indicated at ac' in FIG. 3. The asynchronous address codes ac' are fed via a multiple 27 to a input of a multiplexer $MX_2$ which receives the synchronous codes ac on another input via a multiple 15 having a branch 15'; the output of this multiplexer is the multiple 5 which has another branch 14 terminating at one input of a comparator CO whose other input is connected to branch multiple 15'. The multiplexer is switched by a clock signal ck", between subphases $\phi_1$, $\phi_2$ and again between subphases $\phi_3$, $\phi_4$, concurrently with another multiplexer $MX_3$ having an input multiple 20 extending from logic circuit LC and another input multiple 28 carrying data bits from processor PR. Thus, multiplexer $MX_3$ alternately connects these two input multiples to writing multiple 2w.

In the first subphase $\phi_1$, multiplexer $MX_2$ supplies a reading address ac to memory ME while logic circuit LC receives a retrieved data word via reading multiple 2r to which it is switched by the clock pulse ck' as indicated in FIG. 1. In the second subphase $\phi_2$, with multiplexer $MX_2$ in its alternate position, the logic circuit may be again connected to multiple 2r by a switching signal from processor PR in order to read out of turn the contents of a memory stage identified by an address code ac'. In subphase $\phi_3$, in which the position of multiplexers $MX_2$ and $MX_3$ has not changed from the preceding subphase, multiple 28 is linked with multiple 2w whereby data bits DA furnished by the processor can be loaded out of turn into a memory stage again identified by an address ac' on multiple 27. In subphase $\phi_4$, finally, the multiplexers have returned to their starting position whereby synchronous loading of a memory stage takes place, as in the preceding embodiment, under the control of clock signal ck',and at a stage identified by the regular address code ac.

If, in a subphase $\phi_2$, an asynchronous reading address ac' identifies a memory stage already scanned in the current cycle, the data word read out will be one written in during the same cycle, thus requiring a cancellation of the one-cycle delay between the control sequences appearing on leads 13w and 13r. Such cancellation will also be necessary if an asynchronous inscription takes place in a subphase $\phi_3$ at a stage not yet scanned in the current cycle since that stage will be synchronously read in the same cycle. These shifts in the relative timing of the inversion commands on lead 13w and their replicas on lead 13r are carried out with the aid of an adjustable delay circuit CC comprising a pair of electronic switches $C_1$ and $C_2$ normally connecting leads 13w and 13r to respective outputs, here designated 18w and 18r, of pseudo-random pulse generator PS. A branch 19w of lead 18w extends to an alternate terminal of switch $C_2$ whereas a branch 19r of lead 18r connects the latter to an alternate terminal of switch $C_1$. Comparator CO has two output leads 16 and 17 terminating at respective control electrodes of switches $C_1$ and $C_2$.

During synchronous scanning, i.e. in subphases $\phi_1$ and $\phi_4$, the address code ac on multiple 15 also appears on multiple 5 so that the same bit combinations are present in the inputs 14 and 15' of comparator CO. Under these conditions the comparator does not energize either of its output leads so that switches $C_1$ and $C_2$ remain in their full-line positions; the system of FIG. 3 then operates in essentially the same way as that of FIG. 2.

If, as assumed, the numerical value of the regular address codes ac increases progressively from 1 through n in the course of a scanning cycle, an out-of-turn address code ac' will identify a stage not yet scanned if its numerical value or rank is greater than that of the current synchronous code, i.e., if ac' > ac. In the opposite case, i.e., if ac' < ac, the asynchronously addressed stage has already been scanned and will therefore not normally be readdressed in the same cycle. In the first instance, comparator CO energizes its output 16 to reverse the switch $C_1$. If this occurs in a reading subphase $\phi_2$, the data word retrieved from the memory stage is one written therein during the preceding cycle and, with the position of switch $C_2$ remaining unchanged, the control sequence on lead 13r has its normal one-cycle delay so that its time position is the same as in the immediately preceding subphase $\phi_1$. In the second instance, comparator output 17 is energized to reverse the switch $C_2$. If this takes place in a writing subphase $\phi_3$, the newly inscribed word will not be read out until the next cycle; since switch $C_1$ has remained in its normal position, the control sequence on lead 13w will have the same position as in the immediately following subphase $\phi_4$.

If, however, the condition ac' > ac arises in a writing subphase $\phi_3$, the control sequence on lead 13w coincides with that on lead 13r so that their relative offset is canceled. Thus, proper reinversion (if necessary) will take place when the asynchronously inscribed data word is retrieved later in the cycle.

Analogously, the occurrence of the condition ac' < ac during a reading subphase $\phi_2$ substitutes the undelayed control sequence from generator output 18w for the delayed sequence of generator output 18r normally transmitted to lead 13r. Thus, the out-of-turn reading of a data word written during the same cycle will also proceed in the correct manner.

If the asynchronous data bits DA on multiplexer 28 do not fill all the cells reserved for such bits in any stage of memory ME, the passage of these bits DA through component GPD may result in the insertion of a parity bit inconsistent with the structure of the data word already stored in that memory stage which is only partially modified by the newly arriving bits. Since this may result in an untimely error indication, I prefer to deactivate the parity tester CP during the reading of data words modified by asynchronous writing. This may be accomplished, as shown, by the transmission of a special bit from processor PR during a writing subphase $\phi_3$ to a separate cell of the corresponding memory stage via a lead 29 bypassing the inverter TCw, this special bit appearing during readout on a lead 30 to block the parity check. The special bit is canceled either at that time, by a destructive readout, or subsequently upon the next loading of the same register stage by a synchronously inscribed data word lacking such a bit. The temporary disabling of parity tester CP will not significantly affect the ability of the system to detect a malfunction of a memory cell inasmuch as the same cell defect will again show up during synchronous writing and reading.

Except for certain rarely occurring malfunctions, such as the accidental transposition of two addresses, the system according to my invention will thus reveal any sustained malfunction of memory ME and associated circuitry in a very short time.

I claim:

1. A method of testing the performance of a multistage memory whose stages are periodically addressed in respective time slots of a recurrent scanning cycle, each time slot being divided into a reading phase and a writing phase, for inscribing an incoming multibit data word in an addressed memory stage during a writing phase and retrieving an inscribed data word from an addressed memory stage during a reading phase of any time slot, comprising the steps of:

generating, during certain scanning cycles selected in a generally stochastic manner, inversion commands for replacing the bits of said incoming words by their complements at a location upstream of said memory prior to inscribing said incoming words in the respective memory stages;

supplementing said incoming data words, between said upstream location and said memory, with party criteria written along with said data words in the respective memory stages;

replicating said inversion commands at a location downstream of said memory for reinverting inverted data words retrieved from said memory stages;

replicating said inversion commands at a location downstream of said memory for reinverting inverted data words retrieved from said memory stages;

performing a parity check on retrieved data words between said memory and said downstream location; and generating an alarm signal upon a recurrent negative outcome of said parity check in any bit position in homologous time slots of consecutive scanning cycles.

2. A method as defined in claim 1 wherein the reading phase of each time slot precedes the writing phase thereof whereby a data word inscribed in a memory stage during a given scanning cycle is retrieved therefrom during an immediately following scanning cycle, the replication of said inversion commands being delayed by one scanning cycle.

3. A method as defined in claim 2 wherein the addressing of said memory stages proceeds in a predetermined order in one part of each reading and writing phase of any scanning cycle and wherein other parts of said phases are available for out-of-turn reading and writing, comprising the futher steps of comparing the address of a memory stage addressed out of turn with the address called for by said predetermined order and modifying the relative timing of a corresponding inversion command and its replication in accordance with the relative ranks of the compared addresses.

4. A method as defined in claim 3 wherein out-of-turn writing affects less than all the bits of a data word already inscribed in a given stage, comprising the further step of blocking said parity check on retrieving a data word altered by the out-of-turn writing.

5. A method as defined in claim 1 wherein said parity criteria are supplemental bits of a value determined by the combined bits of the data words to be inscribed and respective address codes identifying the corresponding memory stages, said parity check being carried out on combinations of retrieved data words and respective address codes.

6. In a data-handling system, in combination:

a multistage memory provided with addressing means for periodically identifying the stages thereof in respective time slots of a recurrent cycle, input means for inscribing an incoming multibit data word in an identified memory stage during a writing phase of any time slot, and output means for retrieving an inscribed data word from an indentified memory stage during a reading phase of any time slot;

first conductor means connected to said input means for delivering said incoming data words to said memory;

second conductor means connected to said output means for reading out the data words retrieved from said memory;

first selective inversion means inserted in said first conductor means;

second selective inversion means inserted in said second conductor means;

a supply of control signals synchronized with said scanning means connected to said first inversion means for selectively actuating same, during certain scanning cycles selected in a generally stochastic manner, to replace the bits of said incoming data words by their complements prior to inscription thereof in the respective memory stages, said supply being further connected to said second inversion means for selectively actuating same, in timed relationship with the actuation of said first inversion means, to reinvert inverted data words retrieved from said memory stages;

bit-checking means connected to said first conductor means at a point between said first inversion means and said input means for supplementing said incoming data words with parity criteria written along with said data words in the respective memory stages;

parity-check means connected to said second conductor means at a point between said output means and said second inversion means for verifying the correct operation of said memory; and alarm means connected to said parity-check means for indicating a malfunction upon a recurrent negative outcome of a parity check in any bit position in homologous time slots of consecutive scanning cycles.

7. The combination in claim 6 wherein said supply comprises a pseudo-randum generator of binary signals.

8. The combination as defined in claim 6 wherein said addressing means includes a binary counter emitting a succession of regular address codes in a predetermined order, a source of out-of-turn address codes, and switchover means operable to connect said counter to said memory in one part of each reading and writing phase and to connect said source to said memory in another part of at least some reading and writing phases; further comprising comparison means connected to receive said regular and out-of-turn address codes for determining their relative numerical values, and delay means controlled by said comparison means for modifying the relative timing of the actuation of said first and second inversion means in accordance with said relative numerical values.

9. The combination defined in claim 8 wherein said switchover means has a first input connection, energizable by said counter, a second input connection energizable by said source, and an output connection leading to said memory, said comparison means having input terminals tied to said first input connection and to said output connection.

10. The combination defined in claim 9 wherein said supply is provided with a first output lead carrying a first sequence of control signals and with a second output lead carrying a second sequence of control signals related to said first sequence but lagging same by one scanning cycle, said delay means including first switch means connected to said first output lead and second switch means connected to said second output lead, said first switch means being responsive to said comparison means for extending said second output lead to said first inversion means upon the regular address code preceding the out-of-turn address code in said predetermined order and for extending said first output lead to said first inversion means under all other conditions, said second switch means being responsive to said comparison means for extending said first output lead to said second inversion means upon the out-of-turn address code preceding the regular address code in said predetermined order and for extending said second output lead to said second inversion means under all other conditions.

11. The combination defined in claim 6, further comprising a first parity-bit inserter connected to saidaddressing means for receiving address codes of memory stages identified thereby, said bit-checking means including a second parity-bit inserter connected to said addressing means for receiving said address codes in addition to the incoming data words from said first conductor means, said parity-check means being connected to said addressing means for receiving said address codes in addition to the retrieved data words from said second conductor means.

12. The combination defined in claim 11 wherein said second parity-bit inserter and said parity-check means are connected to said addressing means by way of said first parity-bit inserter.

* * * * *